(12) United States Patent
Harame et al.

(10) Patent No.: US 9,758,365 B2
(45) Date of Patent: Sep. 12, 2017

(54) INTEGRATED SEMICONDUCTOR DEVICES WITH SINGLE CRYSTALLINE BEAM, METHODS OF MANUFACTURE AND DESIGN STRUCTURE

(71) Applicant: GLOBALFOUNDRIES Inc., George Town (KY)

(72) Inventors: David L. Harame, Essex Junction, VT (US); Anthony K. Stamper, Williston, VT (US)

(73) Assignee: GLOBALFOUNDRIES INC., George Town (KY)

( * ) Notice: Subject to any disclaimer, the term of this patent is extended or adjusted under 35 U.S.C. 154(b) by 0 days.

(21) Appl. No.: 14/821,997

(22) Filed: Aug. 10, 2015

(65) Prior Publication Data

US 2015/0344293 A1  Dec. 3, 2015

Related U.S. Application Data

(62) Division of application No. 13/294,603, filed on Nov. 11, 2011, now Pat. No. 9,105,751.

(51) Int. Cl.
*H01L 29/84* (2006.01)
*B81B 3/00* (2006.01)
(Continued)

(52) U.S. Cl.
CPC .......... *B81B 3/0027* (2013.01); *H01L 21/84* (2013.01); *H01L 27/1203* (2013.01); *H03H 3/02* (2013.01);
(Continued)

(58) Field of Classification Search
CPC ....... H01L 2224/73265; H01L 2924/00; H01L 41/1136; H01L 21/02532
See application file for complete search history.

(56) References Cited

U.S. PATENT DOCUMENTS 3,614,678 A 10/1971 Engeler et al.
5,427,975 A  6/1995 Sparks et al.
(Continued)

OTHER PUBLICATIONS

J.H. Hales et al. "Longitudinal bulk acoustic mass sensor", DTU Nanotech, 2009, IEEE, pp. 311-314, Technical University of Denmark, Kgs. Lyngby, Denmark.
(Continued)

*Primary Examiner* — Zandra Smith
*Assistant Examiner* — John M Parker
(74) *Attorney, Agent, or Firm* — Anthony Canale; Andrew M. Calderon; Roberts Mlotkowski Safran Cole & Calderon, P.C.

(57) ABSTRACT

Bulk acoustic wave filters and/or bulk acoustic resonators integrated with CMOS devices, methods of manufacture and design structure are provided. The method includes forming a single crystalline beam from a silicon layer on an insulator. The method further includes providing a coating of insulator material over the single crystalline beam. The method further includes forming a via through the insulator material exposing a wafer underlying the insulator. The insulator material remains over the single crystalline beam. The method further includes providing a sacrificial material in the via and over the insulator material. The method further includes providing a lid on the sacrificial material. The method further includes venting, through the lid, the sacrificial material and a portion of the wafer under the single crystalline beam to form an upper cavity above the single crystalline beam and a lower cavity in the wafer, below the single crystalline beam.

13 Claims, 8 Drawing Sheets

(51) Int. Cl.

| | | |
|---|---|---|
| *H01L 21/84* | (2006.01) | |
| *H01L 27/12* | (2006.01) | |
| *H03H 3/02* | (2006.01) | |
| *H03H 9/10* | (2006.01) | |
| *H03H 9/17* | (2006.01) | |
| *H01L 41/113* | (2006.01) | |
| *H03H 1/00* | (2006.01) | |
| *H03H 9/24* | (2006.01) | |
| *H03H 9/15* | (2006.01) | |

(52) U.S. Cl.
CPC .......... *H03H 9/1007* (2013.01); *H03H 9/173* (2013.01); *B81B 2201/0285* (2013.01); *H01L 41/1136* (2013.01); *H01L 2224/73265* (2013.01); *H03H 2001/0064* (2013.01); *H03H 2003/027* (2013.01); *H03H 2009/155* (2013.01); *H03H 2009/241* (2013.01)

(56) References Cited

U.S. PATENT DOCUMENTS

| | | |
|---|---|---|
| 5,511,427 A | 4/1996 | Burns |
| 5,834,646 A | 11/1998 | Kvisteroy et al. |
| 5,985,412 A | 11/1999 | Gosele |
| 6,079,274 A | 6/2000 | Ando et al. |
| 6,118,164 A | 9/2000 | Seefeldt et al. |
| 6,452,238 B1 | 9/2002 | Orcutt et al. |
| 6,635,509 B1 | 10/2003 | Ouellet |
| 6,660,564 B2 | 12/2003 | Brady |
| 6,710,461 B2 | 3/2004 | Chou et al. |
| 7,138,293 B2 | 11/2006 | Ouellet et al. |
| 7,154,173 B2 | 12/2006 | Ikeda et al. |
| 7,250,353 B2 | 7/2007 | Nasiri et al. |
| 7,262,622 B2 | 8/2007 | Zhao |
| 7,552,645 B2 | 6/2009 | Bargatin et al. |
| 7,615,845 B1 | 11/2009 | Blixhavn |
| 7,763,947 B2 | 7/2010 | Zhan et al. |
| 7,824,098 B2 | 11/2010 | Melamud et al. |
| 7,846,811 B2 | 12/2010 | Villa et al. |
| 8,071,398 B1 | 12/2011 | Yang |
| 8,106,724 B1 * | 1/2012 | Wang .................. H03H 9/2463 310/367 |
| 8,227,911 B1 | 7/2012 | Yang |
| 8,546,240 B2 | 10/2013 | Harame et al. |
| 8,629,036 B2 | 1/2014 | Luce et al. |
| 8,704,238 B2 | 4/2014 | Yang |
| 8,921,201 B2 * | 12/2014 | Luce .................. H01L 21/84 257/522 |
| 2001/0013630 A1 | 8/2001 | Cho et al. |
| 2001/0048265 A1 | 12/2001 | Miller et al. |
| 2002/0096421 A1 | 7/2002 | Cohn et al. |
| 2004/0021403 A1 * | 2/2004 | Ayazi .................. H03H 3/02 310/365 |
| 2004/0026755 A1 | 2/2004 | Kim |
| 2006/0098059 A1 * | 5/2006 | Ohguro .................. B81B 3/0018 347/72 |
| 2006/0205106 A1 | 9/2006 | Fukuda et al. |
| 2007/0044296 A1 * | 3/2007 | Jeon .................. H04R 17/00 29/594 |
| 2008/0096301 A1 | 4/2008 | Ramamoorthi et al. |
| 2009/0211359 A1 | 8/2009 | O'Mahony et al. |
| 2010/0072626 A1 | 3/2010 | Theuss et al. |
| 2010/0075481 A1 | 3/2010 | Yang |
| 2011/0314669 A1 | 12/2011 | Stamper et al. |

OTHER PUBLICATIONS

J. Teva et al. "From VHF to UHF CMOS-MEMS Monolithically Integrated Resonators", Jan. 13-17, 2008, pp. 82-85, Universitat Autonoma de Barcelona, Spain, IEEE.

V. Kaajakari et al. "Nonlinear Limits for Single-Crystal Silicon Microresonators", Journal of Microelectromechanical Systems, pp. 715-724, vol. 13, No. 5, Oct. 2004.

Suni, T. et al., "Direct wafer bonding for MEMS and microelectronics", VTT Publications 609, ESPOO 2006, 94 pages.

"Film Bulk Acoustic Resonator (FBAR)", http://www.coventor.com/mems/applications/FBAR.html, Coventor, retrieved Nov. 11, 2011, pp. 1-3.

"Flim Bulk Acoustic-Wave Resonator (FBAR)", http://mems.usc.edu/fbar.htm, Research Area University of Southern California, retrieved Nov. 11, 2011, pp. 1-3.

* cited by examiner

Bottom metal    Top metal

Metal

INTEGRATED SEMICONDUCTOR DEVICES WITH SINGLE CRYSTALLINE BEAM, METHODS OF MANUFACTURE AND DESIGN STRUCTURE

FIELD OF THE INVENTION

The invention relates to semiconductor structures and methods of manufacture and, more particularly, to bulk acoustic wave filters and/or bulk acoustic resonators integrated with CMOS processes, methods of manufacture and design structure.

BACKGROUND

Bulk Acoustic Wave (BAW) filter and Bulk Acoustic Resonator (BAR) are gaining more popularly for their performance benefits and are being utilized in the design of today's cutting-edge mobile devices and systems. However, due to manufacturing complexities, Bulk Acoustic Wave (BAW) filter and Bulk Acoustic Resonator (BAR) are fabricated as standalone devices. That is, the Bulk Acoustic Wave (BAW) filter and Bulk Acoustic Resonator (BAR) are not provided as integrated structures with other CMOS, BIiCMOS, SiGe HBT, and/or passive devices, thus leading to higher manufacturing costs, and increased fabrication processing.

Accordingly, there exists a need in the art to overcome the deficiencies and limitations described hereinabove.

SUMMARY

In a first aspect of the invention, a method comprises forming a single crystalline beam from a silicon layer on an insulator. The method further comprises providing a coating of insulator material over the single crystalline beam. The method further comprises forming a via through the insulator material exposing a wafer underlying the insulator. The insulator material remains over the single crystalline beam. The method further comprises providing a sacrificial material in the via and over the insulator material. The method further comprises providing a lid on the sacrificial material. The method further comprises venting, through the lid, the sacrificial material and a portion of the wafer under the single crystalline beam to form an upper cavity above the single crystalline beam and a lower cavity in the wafer, below the single crystalline beam.

In another aspect of the invention, a method comprises forming a single crystalline beam from a single crystalline silicon layer of an SOI substrate. The method further comprises protecting the single crystalline beam with an insulator material during cavity formation. The cavity formation comprises forming an upper cavity and a lower cavity above and below the single crystalline beam, respectively. The upper cavity is formed above a BOX layer of the SOI substrate, by etching of a sacrificial layer formed over the insulator material that coats and protects exposed portions of the single crystalline beam. The lower cavity is formed below the BOX layer by etching a portion of bulk substrate through a connecting via formed between the upper cavity and the lower cavity. The connecting via is lined with the insulator material that coats and protects the exposed portions of the single crystalline beam.

In yet another aspect of the invention, a structure comprises a single crystalline beam formed from a silicon layer of an silicon on insulator (SOI) substrate. The structure further comprises insulator material coating the single crystalline beam. The structure further comprises an upper cavity formed above the single crystalline beam, over a portion of the insulator material. The structure further comprises a lower cavity formed in bulk substrate of the SOI substrate, below the single crystalline beam and a BOX layer of the SOI substrate. The structure further comprises a connecting via that connects the upper cavity to the lower cavity, the connecting via being coated with the insulator material. The structure further comprises a Bulk Acoustic Wave (BAW) filter or Bulk Acoustic Resonator (BAR) in electrical connection with the single crystalline beam.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structure, which comprises the structures of the present invention. In still further embodiments, a method in a computer-aided design system is provided for generating a functional design model of the semiconductor structure. The method comprises generating a functional representation of the structural elements of the semiconductor structure.

More specifically, in embodiments of the present invention, a design structure readable by a machine used in design, manufacture, or simulation of an integrated circuit is provided. The design structure comprises: a single crystalline beam formed from a silicon layer of an silicon on insulator (SOI) substrate; insulator material coating the single crystalline beam; an upper cavity formed above the single crystalline beam, over a portion of the insulator material; a lower cavity formed in bulk substrate of the SOI substrate, below the single crystalline beam and a BOX layer of the SOI substrate; a connecting via that connects the upper cavity to the lower cavity, the connecting via being coated with the insulator material; and a Bulk Acoustic Wave (BAW) filter or Bulk Acoustic Resonator (BAR) on the single crystalline beam.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 11 shows a top view of a structure in accordance with the present invention, along line A-A of FIG. 10;

FIG. 12 shows a top view of a structure in accordance with an aspect of the present invention.

DETAILED DESCRIPTION

The invention relates to semiconductor structures and methods of manufacture and, more particularly, to bulk acoustic wave filters and/or bulk acoustic resonators integrated with CMOS devices (and processes), methods of manufacture and design structure. More specifically, the present invention is directed to a Bulk Acoustic Wave (BAW) filter or Bulk Acoustic Resonator (BAR) integrated with a CMOS structure such as, for example, a filter surrounded by an upper cavity and lower cavity. In embodiments, the filter is formed from single crystalline silicon, which is part of the active silicon layer of a silicon on insulator (SOI) wafer or used in a BULK silicon wafer implementation. Also, in embodiments, the lower cavity and upper cavity are formed in a single venting step, with the lower cavity formed in the wafer, itself, below a filter beam. The upper cavity is formed in an upper silicon layer using a deposited silicon process. In embodiments, the surface of the filter beam and other devices can be coated in a thin film (e.g., oxide) through an integration process to avoid etching silicon during venting.

More specifically, in embodiments, the present invention comprises an acoustic resonator fabricated using the handle wafer of an SOI substrate to form a lower cavity of a filter beam structure. The filter beam structure is formed from crystalline silicon using the device silicon in a SOI wafer, plus a deposited silicon upper cavity. The surfaces of the filter beam may be coated in a thin oxide through an integration method to avoid etching the SOI silicon during venting of the cavity or to decrease the filter tuning frequency or other electrical parameter variability.

Figure 1:
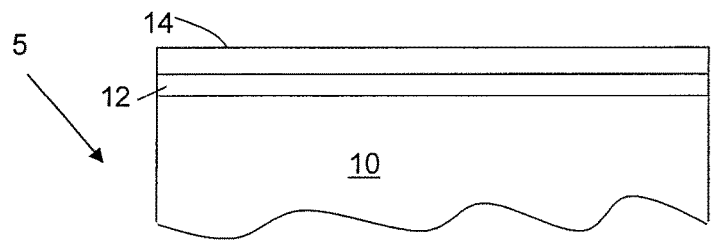
FIG. 1 shows a starting structure in accordance with aspects of the present invention.

FIG. 1 shows a starting structure in accordance with aspects of the present invention. More specifically, FIG. 1 shows a semiconductor substrate or wafer 5. In embodiments, the wafer 5 may comprise a BULK silicon or silicon on insulator (SOI) implementation. In either implementation, for example, the wafer 5 comprises a single crystalline active semiconductor layer 14 (e.g., active silicon) with an insulation layer 12 formed on top of the wafer 5. The insulator layer 12 (also referred to as a BOX in the SOI implementation) is formed on a handle wafer (bulk substrate) 10. In embodiments, the single crystalline active semiconductor layer 14 can have a thickness of about 0.1 to 5 microns and the insulator layer 12 can have a thickness of about 0.1 to 5 microns; although other dimensions are also contemplated by the present invention.

The constituent materials of the SOI wafer or BULK implementation may be selected based on the desired end use application of the semiconductor device. For example, the insulation layer 12, e.g., BOX, may be composed of oxide, such as $SiO_2$. Moreover, the single crystalline active semiconductor layer 14 can be comprised of various semiconductor materials, such as, for example, Si, SiGe, SiC, SiGeC, etc. The SOI wafer 5 may be fabricated using techniques well known to those skilled in the art. For example, the SOI wafer 5 may be formed by conventional processes including, but not limited to, oxygen implantation (e.g., SIMOX), wafer bonding, etc.

Figure 2:
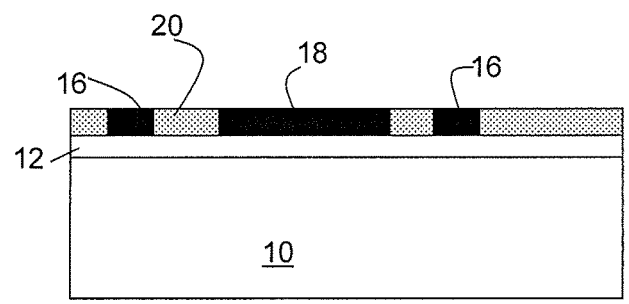
FIGS. 2-3, 4a, 4b, 5, 6a-6d and 7-12 show processing steps and related structures in accordance with aspects of the present invention.

FIG. 2 shows additional processing steps and resultant structure in accordance with aspects of the present invention. For example, FIG. 2 shows the formation of devices 16 and a silicon beam 18 (integrated in CMOS processes with a Bulk Acoustic Wave (BAW) filter or Bulk Acoustic Resonator (BAR)). In embodiments, the devices 16 and silicon beam 18 are formed from the single crystalline active semiconductor layer 14. In embodiments, the devices 16 and beam 18 are formed using conventional lithographic, etching and deposition processes such that further explanation is not required herein. In embodiments, the devices 16 can be, for example, CMOS, BiCMOS, DRAM, FLASH or passive devices formed in the single crystalline silicon layer 14. The devices 16 and beam 18 are separated by shallow trench isolation (STI) structures 20, formed by etching the active silicon layer 14 and depositing an insulation material such as, for example, oxide, in trenches formed by the etching, followed by a chemical mechanical polish step to planarize the wafer, as known in the art.

Figure 3:
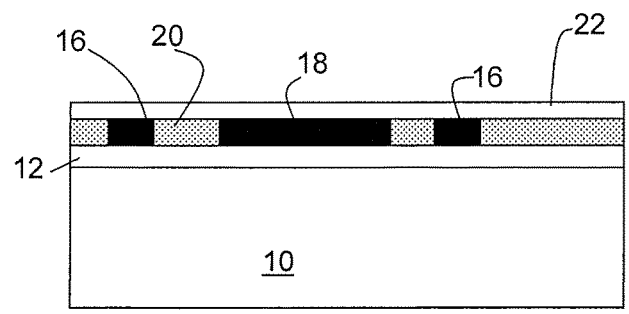

FIG. 3 shows additional processing steps and a related structure in accordance with aspects of the present invention. More specifically, in FIG. 3, an insulator layer 22 is formed over the devices 16, beam 18 and STI structures 20. In embodiments, the insulator layer 22 is an oxide material. The oxide material can be deposited on the devices 16, beam 18 and STI structures 20 using, for example, a chemical vapor deposition (CVD) process or a thermal oxide deposition process. In embodiments, the insulator layer 22 has a thickness of about 1 micron; although other dimensions are also contemplated by the present invention. If insulator layer 22 is formed by thermally oxidizing silicon layer 14, then silicon layer 14 should be thick enough to avoid fully converting it to silicon dioxide. In one exemplary embodiment, silicon layer 14 is 3 microns thick, as fabricated, and the thermally oxidized insulator layer 22 is 0.1 micron thick.

Figure 4A:
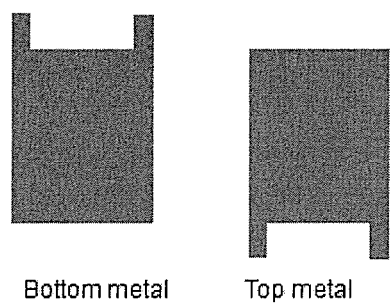
Figure 4B:
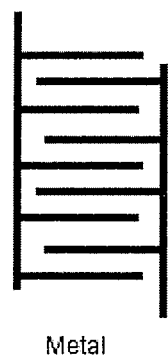

Acoustic wave devices can be fabricated either in a metal-piezoelectric film (PZT)-metal process or in a metal-PZT process. For the metal-PZT-metal embodiment, the acoustic waves are excited vertically between the two metal plates. For the metal-PZT embodiment, the acoustic waves are excited laterally between a comb-finger structure in the metal. In FIGS. 4a and 4b, simplified top view drawings are shown of vertical (FIG. 4a) and lateral (FIG. 4b) bulk acoustic wave filters. FIG. 4a shows simplified top view layouts of the layer 24 (bottom metal) and layer 28 (top metal) in FIG. 5 for a vertical acoustic wave filter. FIG. 4b shows simplified top views of a lateral bulk acoustic wave filter structure, wherein only layer 28 is used for form the filter and layer 24 can either be omitted or used for other purposes, such as a ground plane. The discussion below is limited to the metal-PZT-metal embodiment, although either embodiment is applicable for purposes of discussion.

Figure 5:
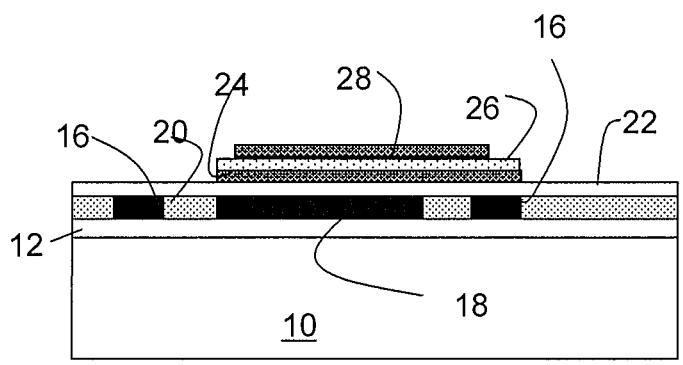

In FIG. 5, a metal layer 24 is formed on the insulator layer 22. A piezoelectric transducer (PZT) film 26 is formed on the metal layer 24. The PZT film 26 can be, for example, aluminum nitride, or other known PZT materials. The PZT film 26 can be used to generate and/or sense an acoustic wave. In this way, the PZT film 26 can be used to integrate a Bulk Acoustic Wave (BAW) filter or Bulk Acoustic Resonator (BAR) in a CMOS process/structure such as, for example, a filter surrounded by an upper cavity and lower cavity (as described further below). A metal layer 28 is formed on the PZT film 26. In embodiments, the metal layers 24, 28 can be, for example, any conductor materials including one or more of, for example, titanium, titanium nitride, tungsten, molybdenum aluminum, aluminum-copper, and similar type of materials know to those of skill in the art. In embodiments, the metal layers 24, 28 and the PZT film 26 are deposited using conventional deposition processes. In embodiments, the conductor layers 24 and 28 can employ the same thickness and materials so that they are symmetric.

As further shown in FIG. 5, the metal layers 24, 28 and the PZT film 26 are patterned using conventional photolithography and etching techniques. For example, a resist can be deposited on the metal layer 28, which is then exposed to light to form a pattern (openings). The metal layers 24, 28 and the PZT film 26 can then be etched through the openings using conventional etching chemistries such as, for example, reactive ion etching (RIE) processes. In embodiments, the metal layers 24, 28 and the PZT film 26 will remain, above, e.g., aligned with, at least the beam 18 and, in embodiments, one or more devices 16. The resist can then be removed using conventional stripping processes such as, for example, conventional ashing processes.

Figure 6A:
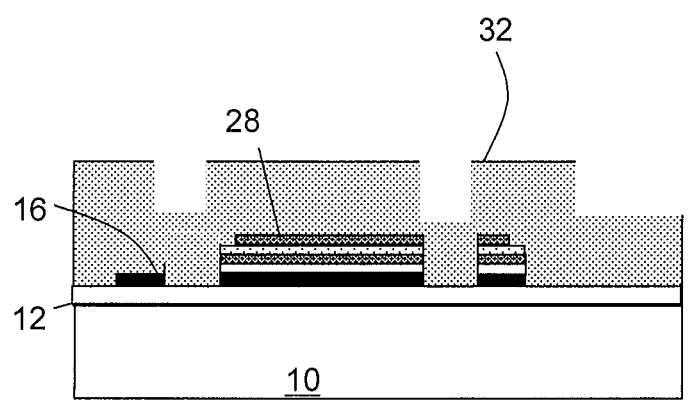

FIGS. 6a-6d show additional processing steps and related structures in accordance with aspects of the present invention. More specifically, FIG. 6a shows deposition of an insulator material 32, e.g., oxide. In embodiments, the insulator material 32 can be an oxide material, deposited using, for example, high density plasma or plasma enhanced high density plasma processes, atomic layer deposition (ALD), or liquid phase chemical vapor deposition (CVD) processes. In embodiments, the deposition of the oxide provides improved gap fill. As shown in FIG. 6a, the insulator material 32 is deposited within the openings 31, as well as over the exposed layers 26, 24, and 28.

Figure 6B:
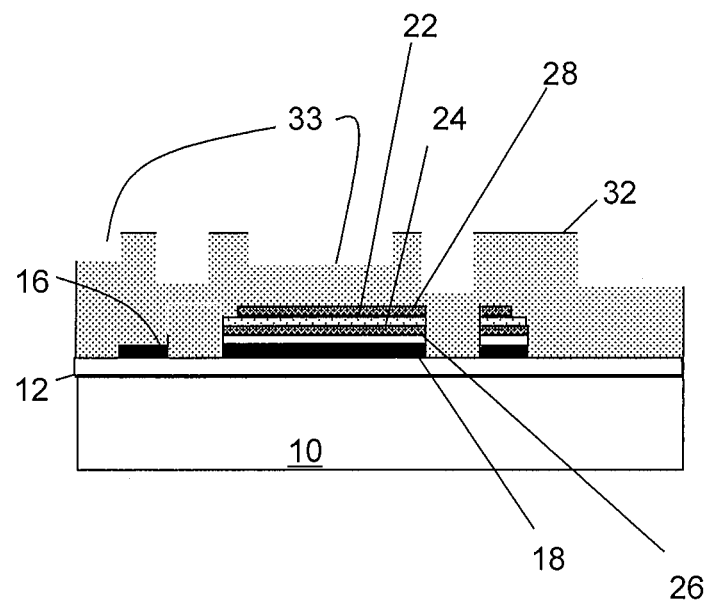

In FIG. 6b, the insulator material 32 is optionally patterned using a reverse mask and RIE process. For example, the reverse etch (reverse damascene process) is performed by depositing a resist on the insulator material 32, which is patterned to form openings. In embodiments, resist edges overlap with edges of the devices 16 and/or beam 18, for example. That is, the resist will slightly mask the devices 16 and beam 18. The insulator material 32 will then undergo an etching process to form openings or patterns 33, which are over the devices 16 and/or beam 18.

Figure 6C:
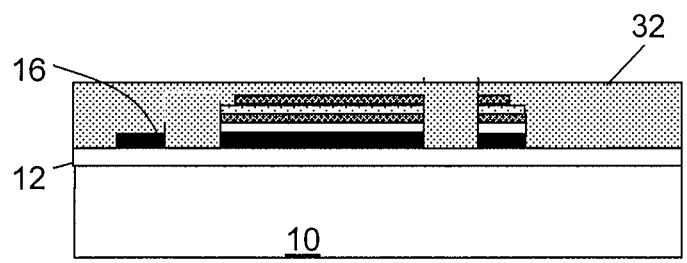
Figure 6D:
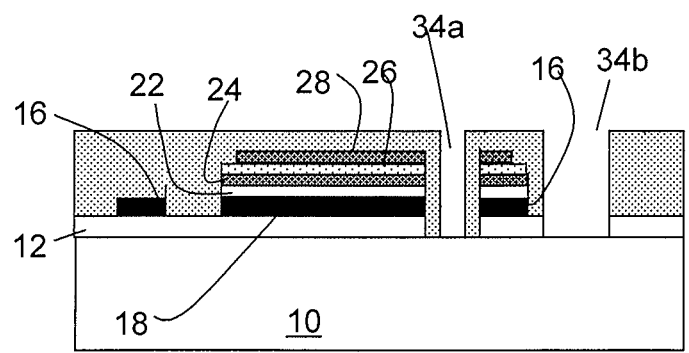

In FIG. 6c, the insulator material 32 undergoes a chemical mechanical polish (CMP) with an optional oxide deposition process. In FIG. 6d, cavity vias 34a and 34b are formed in the structure, to the wafer 10. More specifically, cavity vias 34a, 34b are formed through the insulator material 32 and insulator material 12, exposing portions of the wafer 10. In embodiments, the via 34 is coincident (aligned) with a trench and is formed such that its sidewalls have insulator material 32 thereon such that the insulator material 32 protects (coats) the exposed portions of the beam 18 and its constituent layers. This will protect the beam 18 and its constituent layers during subsequent cavity formation. Accordingly, the cavity vias 34a, 34b remain coated in the same insulator material (e.g., oxide) 32 that coats the beam edges (prior to upper cavity silicon deposition).

More specifically, the insulator material 32 remains on the silicon beam 18, metal layers 24, 28 and PZT film 26, as well as over the devices 16. Even more specifically, in embodiments, the insulator material 32 remains on all exposed surfaces of the beam to, e.g., prevent sacrificial silicon reaction with the PZT film 26, as well as any exposed surfaces of the beam structure. In embodiments, the insulator material 32 prevents an AlN reaction with the sacrificial silicon material used to form the cavity above the filter. The insulator material 32 also protects the silicon beam 18 from being vented or removed during the subsequent silicon cavity venting etch process. In embodiments, the cavity via 34a is about a five (5) micron wide via, which will connect an upper cavity to a lower cavity, in subsequent cavity formation processing steps.

Figure 7:
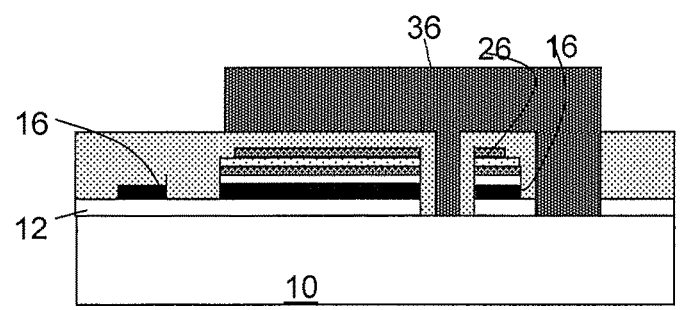

In FIG. 7, the wafer surface is exposed to a native silicon dioxide cleaning and hydrogen passiviation step, such as a 100:1 hydroflouric acid etch, followed by a sacrificial material deposition 36 in the vias 34a and 34b and on the insulator material 32, including above the metal layer 28. Next, the sacrificial material 36 is patterned and etched, as is known in the art. For example, if silicon is used for the sacrificial material 36, it would be patterned with photoresist, the silicon would be RIE etched using a $SF_6$-based chemistry, and the photoresist would be removed in an oxygen plasma. In embodiments, the sacrificial material 36 is a sacrificial silicon material, which can be deposited using any conventional deposition process such as, for example, chemical vapor deposition (CVD) or physical vapor deposition (PVD). In embodiments, the sacrificial silicon material 36 is an upper cavity silicon. In embodiments, the sacrificial silicon material 36 is deposited without oxidized voids or seams in the openings (cavities) 34a and 34b. Oxidized voids are seams or keyholes or pinched off openings in the silicon formed over openings wherein the sides of the seams or keyholes are coated in silicon dioxide, which will not be vented or removed during the subsequent silicon venting step and would leave residuals inside the cavity. Alternatively, the sacrificial material would be deposited without any voids or keyholes over topography, as known in the art. Other materials which can be vented, such as germanium (Ge) could be used in place of silicon.

Figure 8:
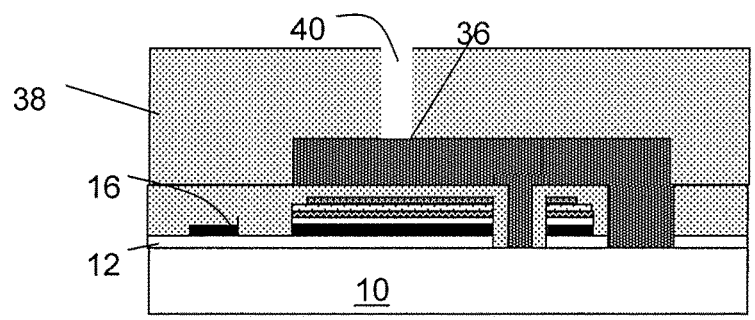

In FIG. 8, a lid material 38 is formed over the sacrificial material 36. In embodiments, lid material is silicon dioxide and is planarized using CMP. A vent hole 40 is formed in the lid material 38, exposing a portion of the sacrificial material 36, e.g., sacrificial silicon material. It should be understood that more than one vent hole 40 can be formed in the lid material 38. The vent hole 40 can be formed using conventional lithographic and etching processes known to those of skill in the art. The width and height of the vent hole 40 determines the amount of material that should be deposited after silicon venting to pinch off the vent hole. In general, the amount of material that should be deposited to pinch off the vent hole 40 decreases as the vent hole width decreases; and as the vent hole aspect ratio, which is the ratio of the vent hole height to width, increases. In embodiments, for example, the vent hole 40 is about 3 μm tall and 1 μm wide; although other dimensions are also contemplated by the present invention. In embodiments, the vent hole 40 may be circular or nearly circular, to minimize the amount of subsequent material needed to pinch it off.

Figure 9:
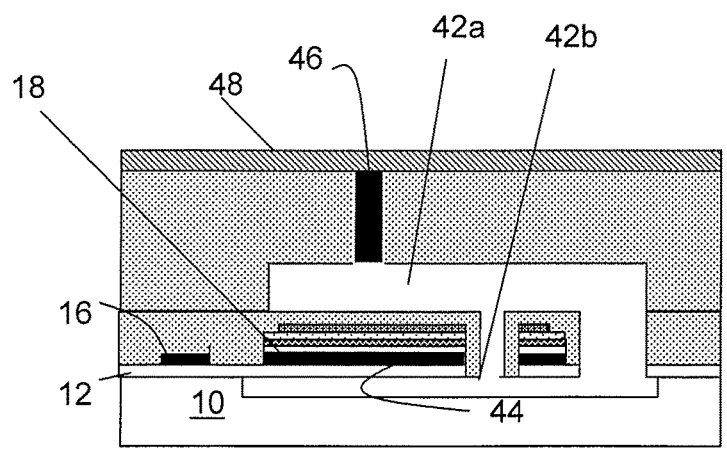

As shown in FIG. 9, the vent hole 40 is used to form an upper cavity 42a and a lower cavity 42b in a single venting process. More specifically, the vent hole 40 provides access for venting (e.g., etching) the sacrificial silicon material 36 and wafer material 10, underneath the beam structure 44 (e.g., layers 18, 22, 24, 26 and 28 (with oxide film)). In embodiments, the exposed silicon or other upper cavity 36 material is cleaned of native oxide and hydrogen passivated using a hydrofluoric acid clean followed by silicon venting or etching using a $XeF_2$ etchant through the vent hole 40, which will strip all of the exposed silicon material. The oxide material 32 can be used to protect the beam structure 44 and its constituent layers (e.g., layers 18, 22, 24, 26 and 28) during the venting process. In embodiments, the oxide material can be about 100 nm over the beam structure 44 to prevent silicon reaction with aluminum nitride PZT film and/or Molybdenum or other materials contacting the PZT film 26.

In embodiments, the venting will form the upper cavity 42a and the lower cavity 42b, which surrounds the beam structure 44. That is, the upper cavity 42a is located above the BOX or insulator layer 12 (formed by removal of the sacrificial silicon material 36) and below the BOX or insulator layer 12 (formed by removal of a portion of the substrate material 10). The upper cavity 42a and the lower cavity 42b can be about 2 μm; although other dimensions are also contemplated by the present invention. In embodiments, the beam structure 44 comprises the single crystalline silicon beam 18 surrounded by oxide material. In embodiments, the structure, and in particular, the exposed sacrificial silicon material 36, can be cleaned with an HF solution prior to venting to remove the native oxide.

As further shown in FIG. 9, the vent hole can be sealed with a material 46, such as a dielectric or metal. This will provide a hermetic seal to the upper cavity 42a and the lower cavity 42b. An optional layer 48 can also be deposited to provide a hermetic seal such as, for example, a 500 nm PECVD silicon nitride film or other films known to provide a hermetic seal over material 46.

Figure 10:
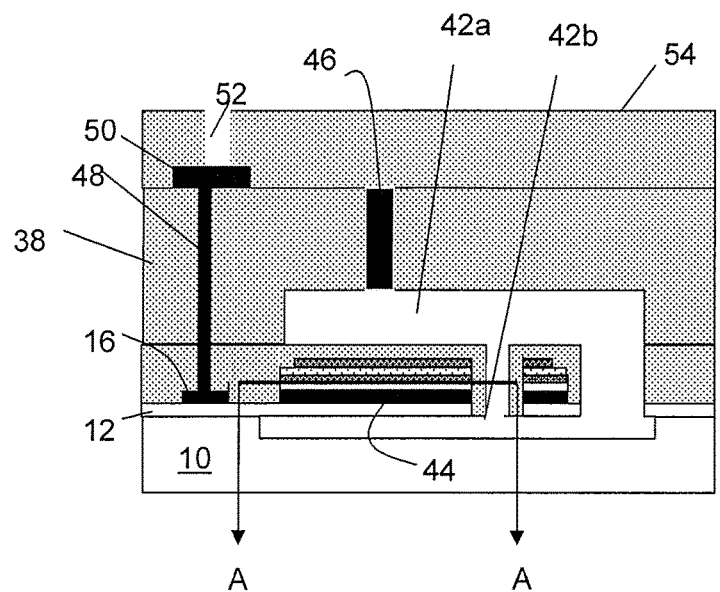

FIG. 10 shows back end of the line processes in accordance with aspects of the present invention. More specifically, FIG. 10 shows via 48 formed in contact with the device 16. In embodiments, the via 48 can be formed by etching a trench into the insulator material 38. In embodiments, the trench can be formed at the same time as the vent hole 40. The trench is then filled with a metal such as, for example, thin TiN followed by thick tungsten, as is known in the art. A wire 50 is formed in contact with the via 48, using conventional wire formation processes. The wire 50 may be, for example, formed using a damascene copper or subtractive-etch aluminum copper process. A final via 52 can be formed in an upper insulator layer 54, deposited on the lid material 38. The final via 52 can be formed using any conventional photolithographic and etching processes. The final via 52 may be provided for wirebond or solder bump processing.

Figure 11:
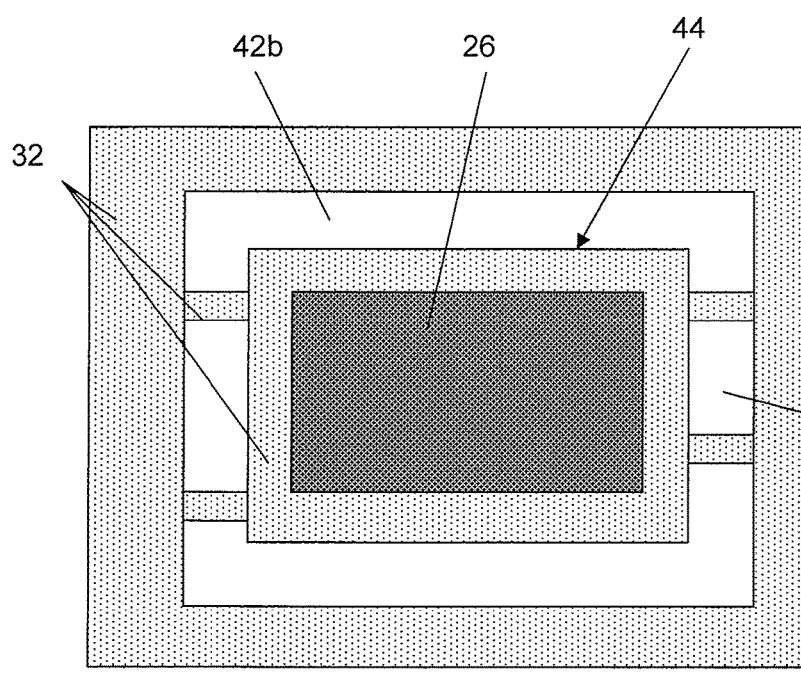

FIG. 11 shows a top view of a structure in accordance with the present invention corresponding to FIG. 10, along line A-A of FIG. 10. More specifically, FIG. 11 shows a cross sectional view, from the top, of the structure of FIG. 10, along line A-A. This top view shows the beam structure 44, with PZT film 26 formed on a metal layer and, more specifically, over the oxide material 32. In embodiments, the oxide material 32 is over the beam structure 44 to prevent silicon reaction with aluminum nitride PZT film and/or Molybdenum or other materials contacting the PZT film 26. Also, as shown in this top view, the lower cavity 42b is formed under the beam structure 44, during the venting step. In embodiments, a venting via 40a is formed between the lower cavity 42b and the upper cavity (not shown) during the venting, in order to form the lower cavity 42b.

Figure 12:
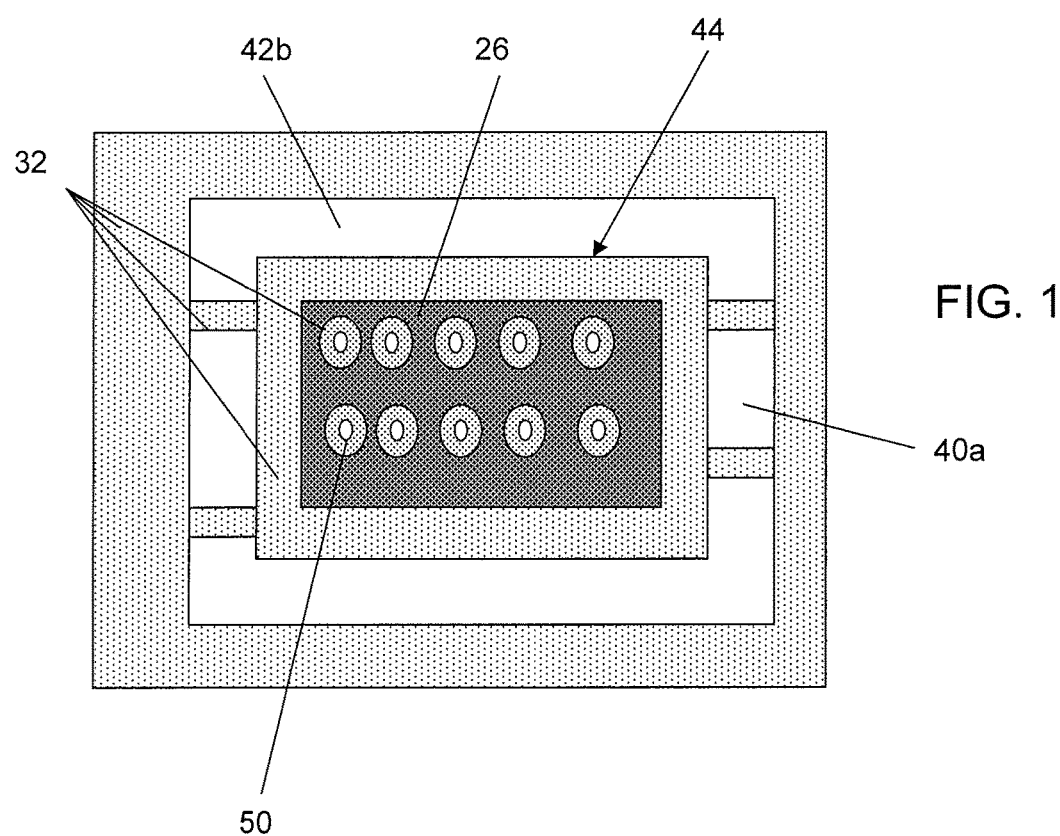

FIG. 12 shows a top view of a structure in accordance with an aspect of the present invention. In this structure, cavities 50 are formed through the beam 44 in order to assist in the formation of the lower cavity 42b. More specifically, through a conventional etching process, cavities 50 can be formed through the beam 44. The cavities can then be lined with an insulator material such as, for example, the oxide material 32 that coats other structures of the present invention. As already described herein, the oxide material 32 will prevent silicon reaction with aluminum nitride PZT film and/or Molybdenum or other materials contacting the PZT film 26, during the venting process for example.

In the process flow, the cavities 50 can be formed after the formation of the beam structure 44, e.g., during the formation processes of FIGS. 6a-6d. For example, a via or trench can be formed in the beam structure, and then filled with an oxide material (e.g., similar to that described in FIGS. 6a-6c. The cavities 50 can then be formed within the oxide material during, for example, the processes of FIG. 6d. A silicon material can then be deposited in the cavities 50 (now lined with the oxide material) during the processes of FIG. 7, which will then be vented during subsequent venting processes described herein.

Figure 13:
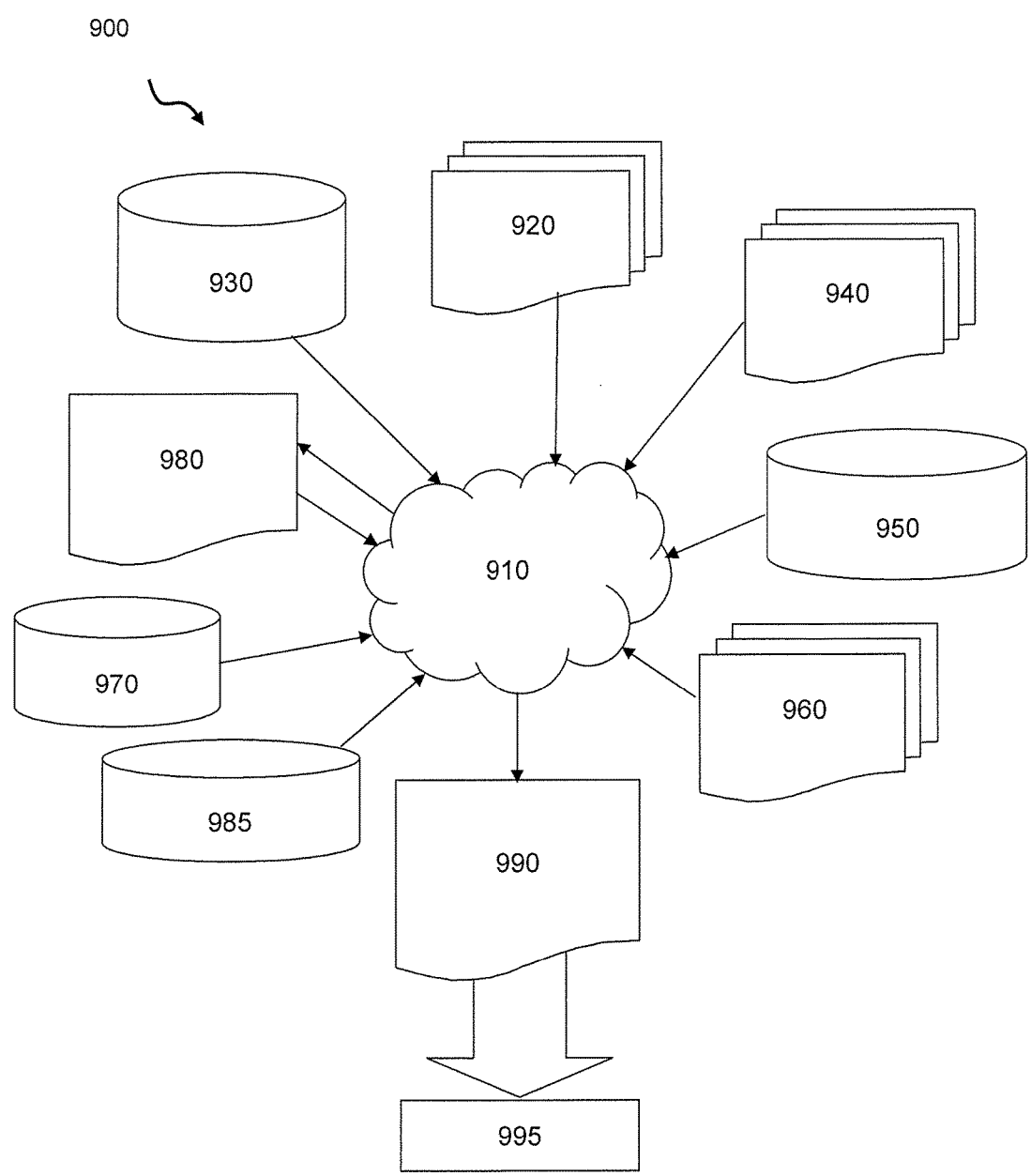
FIG. 13 is a flow diagram of a design process used in semiconductor design, manufacture, and/or test.

FIG. 13 is a flow diagram of a design process used in semiconductor design, manufacture, and/or test. FIG. 13 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-3, 4a, 4b, 5, 6a-6d and 7-12. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 13 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-3, 4a, 4b, 5, 6a-6d and 7-12. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-3, 4a, 4b, 5, 6a-6d and 7-12 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3, 4a, 4b, 5, 6a-6d and 7-12. In one embodiment, design structure 990 may comprise a compiled, executable HDL simulation model that functionally simulates the devices shown in FIGS. 1-3, 4a, 4b, 5, 6a-6d and 7-12.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3, 4a, 4b, 5, 6a-6d and 7-12. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A structure, comprising:
   a single crystalline beam formed from a silicon layer of an silicon on insulator (SOI) substrate;
   one or more devices in the silicon layer, separated from the single crystalline beam by one or more shallow trench isolation structures;
   insulator material coating the single crystalline beam;

an upper cavity formed above the single crystalline beam, over a portion of the insulator material;

a lower cavity formed in bulk substrate of the SOI substrate, below the single crystalline beam and a BOX layer of the SOI substrate;

a connecting via that connects the upper cavity to the lower cavity, the connecting via being coated with the insulator material;

a Bulk Acoustic Wave (BAW) filter or Bulk Acoustic Resonator (BAR) on and separate from the single crystalline beam;

a first metal layer over an insulator layer on the single crystalline beam, a piezoelectric material on the first metal layer, and a second metal layer on the piezoelectric material; and a trench through the first metal layer, the piezoelectric material, the second metal layer and the insulator layer, wherein the insulator material is formed over exposed portions of at least the first metal layer, the piezoelectric material and the second metal layer, and further fills the trench.

2. The structure of claim 1, wherein the BAW filter or BAR is in electrical connection with at least one of the one or more devices.

3. The structure of claim 1, further comprising a lid material over the upper cavity and the insulator material.

4. The structure of claim 3, further comprising a nitride film over the lid material to provide a hermetic seal to the upper cavity and the lower cavity.

5. A structure, comprising:
a single crystalline beam formed from a silicon layer of an silicon on insulator (SOI) substrate;
insulator material coating the single crystalline beam;
an upper cavity formed above the single crystalline beam, over a portion of the insulator material;
a lower cavity formed in bulk substrate of the SOI substrate, below the single crystalline beam and a BOX layer of the SOI substrate;
a connecting via that connects the upper cavity to the lower cavity, the connecting via being coated with the insulator material;
a Bulk Acoustic Wave (BAW) filter or Bulk Acoustic Resonator (BAR) on the single crystalline beam;
layers of metal and piezoelectric material over the silicon layer, wherein the metal layers and piezoelectric material comprises a first metal layer over an insulator layer on the single crystalline beam, the piezoelectric material on the first metal layer, and a second metal layer on the piezoelectric material; and
a trench through the first metal layer, the piezoelectric material, the second metal layer and the insulator layer,
wherein the insulator material is formed over exposed portions of at least the first metal layer, the piezoelectric material and the second metal layer, and further fills the trench.

6. The structure of claim 1, wherein the insulator material is oxide.

7. A design structure stored on a non-transitory machine readable medium used in design, manufacture, or simulation of an integrated circuit, the design structure comprising:
a single crystalline beam formed from a silicon layer of an silicon on insulator (SOI) substrate,
insulator material coating the single crystalline beam;
an upper cavity formed above the single crystalline beam, over a portion of the insulator material;
a lower cavity formed in bulk substrate of the SOI substrate, below the single crystalline beam and a BOX layer of the SOI substrate;
a connecting via that connects the upper cavity to the lower cavity, the connecting via being coated with the insulator material;
a Bulk Acoustic Wave (BAW) filter or Bulk Acoustic Resonator (BAR) on the single crystalline beam;
a first metal layer over an insulator layer on the single crystalline beam, a piezoelectric material on the first metal layer, and a second metal layer on the piezoelectric material; and
a trench through the first metal layer, the piezoelectric material, the second metal layer and the insulator layer,
wherein the insulator material is formed over exposed portions of at least the first metal layer, the piezoelectric material and the second metal layer, and further fills the trench.

8. The design structure of claim 7, wherein the design structure is stored on the non-transitory machine readable medium and comprises a netlist.

9. The design structure of claim 7, wherein the design structure resides on storage medium as a data format used for the exchange of layout data of integrated circuits.

10. The design structure of claim 7, wherein the design structure resides in a programmable gate array.

11. The design structure of claim 7, wherein the BAW filter or BAR is separate from the crystalline beam.

12. The design structure of claim 11, further comprising a lid material over the upper cavity and the insulator material.

13. The design structure of claim 12, further comprising a nitride film over the lid material to provide a hermetic seal to the upper cavity and the lower cavity.

* * * * *